US012747503B2

(12) United States Patent
Matsui

(10) Patent No.: US 12,747,503 B2
(45) Date of Patent: Sep. 29, 2026

(54) PARAMETER SELECTION METHOD AND INFORMATION PROCESSING DEVICE

(71) Applicant: Tokyo Electron Limited, Tokyo (JP)

(72) Inventor: Hidefumi Matsui, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 819 days.

(21) Appl. No.: 18/042,644

(22) PCT Filed: Aug. 23, 2021

(86) PCT No.: PCT/JP2021/030817

§ 371 (c)(1),
(2) Date: Feb. 23, 2023

(87) PCT Pub. No.: WO2022/050111

PCT Pub. Date: Mar. 10, 2022

(65) Prior Publication Data

US 2023/0357931 A1 Nov. 9, 2023

(30) Foreign Application Priority Data

Sep. 4, 2020 (JP) ................................ 2020-149241

(51) Int. Cl.

| | |
|---|---|
| ***C23C 16/52*** | (2006.01) |
| ***C23C 16/455*** | (2006.01) |
| ***H10P 14/60*** | (2026.01) |

(52) U.S. Cl.
CPC ........ *C23C 16/52* (2013.01); *C23C 16/45527* (2013.01); *H10P 14/6339* (2026.01)

(58) Field of Classification Search
CPC .............. C23C 16/52; C23C 16/45527; H01L 21/0228
See application file for complete search history.

(56) References Cited

U.S. PATENT DOCUMENTS

| | | | | |
|---|---|---|---|---|
| 2007/0142957 | A1 * | 6/2007 | Miwa | G05B 13/048 700/121 |
| 2017/0083605 | A1 * | 3/2017 | Yabuki | G06V 10/48 |
| 2018/0239340 | A1 * | 8/2018 | Chen | G07C 3/14 |
| 2019/0295827 | A1 * | 9/2019 | Ohmori | H01J 37/32926 |

FOREIGN PATENT DOCUMENTS

| | | | |
|---|---|---|---|
| JP | 2010-267947 | A | 11/2010 |
| JP | 2019-165123 | A | 9/2019 |
| WO | 2007066404 | A1 | 6/2007 |
| WO | 2018061841 | A1 | 4/2018 |
| WO | 2018061842 | A1 | 4/2018 |

* cited by examiner

*Primary Examiner* — Catherine T. Rastovski
*Assistant Examiner* — Sharad Timilsina
(74) *Attorney, Agent, or Firm* — Armstrong Teasdale LLP

(57) ABSTRACT

A parameter selection method for causing a computer to execute processing steps including: (a) acquiring a plurality of parameters in measurement data of a plurality of sensors regarding a process in a substrate processing apparatus and result data of the process corresponding to the measurement data; (b) classifying the acquired parameters into a plurality of groups by a specific clustering method; (c) selecting parameters having a large effect on the result data based on a threshold value for each of the plurality of groups; (d) repeating the step of (c) in a tournament format between the groups for the parameters selected for each of the groups; and (e) selecting parameters highly correlated with the result data by correlation analysis between the parameters selected in the step of (d).

11 Claims, 12 Drawing Sheets

PARAMETER SELECTION METHOD AND INFORMATION PROCESSING DEVICE

CROSS-REFERENCE TO RELATED APPLICATIONS

The present application is a U.S. National Stage Entry of International Patent Application No. PCT/JP2021/030817, filed Aug. 23, 2021, which claims the benefit of priority to Japanese Patent Application No. 2020-149241, filed Sep. 4, 2020, each of which is hereby incorporated herein by reference in its entirety.

TECHNICAL FIELD

The present disclosure relates to a parameter selection method and an information processing device.

BACKGROUND

A substrate processing apparatus processes a substrate based on a process recipe. A recipe is composed of a plurality of steps. For example, the recipe can control various parameters such as a pressure and a temperature for each step, thereby obtaining optimum processing results. Since the set values of various parameters may be different for each step, statistical data obtained by performing various statistical processing on the measurement data of a plurality of sensors provided in the substrate processing apparatus for each step is managed for each substrate. When various statistical processes are performed on a plurality of sensors for each step, a large amount of data exceeding 1,000,000 is handled as the statistical data. As the use of such statistical data, it has been proposed to detect abnormalities by generating predicted values from the statistical data.

PRIOR ART DOCUMENT

Patent Document

Patent Document 1: International Publication No. 2018/061842

The present disclosure provides some embodiments of a parameter selection method and an information processing device capable of efficiently selecting parameters having a large effect on a substrate processing result.

SUMMARY

According to one embodiment of the present disclosure, there is provided a parameter selection method for causing a computer to execute processing steps including: (a) acquiring a plurality of parameters in measurement data of a plurality of sensors regarding a process in a substrate processing apparatus and result data of the process corresponding to the measurement data; (b) classifying the acquired parameters into a plurality of groups by a specific clustering method; (c) selecting parameters having a large effect on the result data based on a threshold value for each of the plurality of groups; (d) repeating the step of (c) in a tournament format between the groups for the parameters selected for each of the groups; and (e) selecting parameters highly correlated with the result data by correlation analysis between the parameters selected in the step of (d).

According to the present disclosure, it is possible to efficiently select parameters having a large effect on a substrate processing result.

DETAILED DESCRIPTION

An embodiment of the disclosed parameter selection method and information processing device will be described below in detail with reference to the drawings. The disclosed technique is not limited by the following embodiment.

When analyzing a large amount of statistical data obtained by performing various statistical processes on the measurement data of a plurality of sensors installed in a substrate processing apparatus, it can take several months to complete the analysis because an expert makes search based on past knowledge. For example, in order to specify parameters corresponding to sensors having a large effect on a substrate processing result, it is necessary to search measurement data from a plurality of sensors. However, it is difficult to easily select parameters having a large effect on a substrate processing result. Therefore, it is expected to efficiently select parameters having a large effect on a substrate processing result.

[Configuration of Information Processing System 1]

Figure 1:
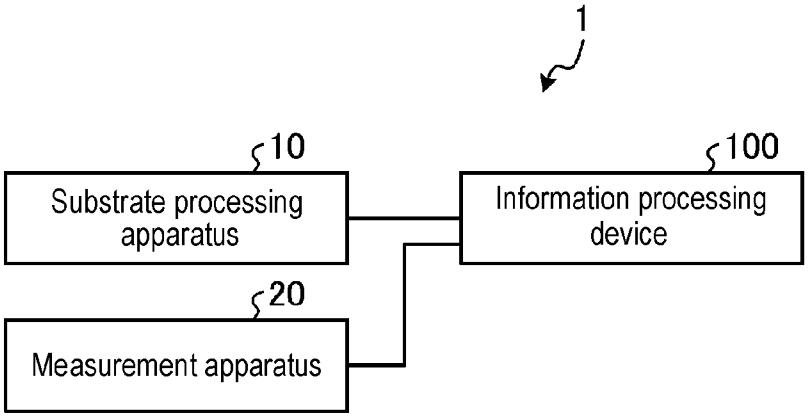
FIG. 1 is a block diagram illustrating an example of an information processing system according to an embodiment of the present disclosure.

FIG. 1 is a block diagram showing an example of an information processing system according to an embodiment of the present disclosure. The information processing system 1 shown in FIG. 1 includes a substrate processing apparatus 10, a measurement apparatus 20 and an information processing device 100. The substrate processing apparatus 10 and the measurement apparatus 20 are connected to the information processing device 100 by, for example, a wired or wireless LAN (Local Area Network). In addition, each of the substrate processing apparatus 10, the measurement apparatus 20 and the information processing device 100 may be plural.

The substrate processing apparatus 10 is a film forming apparatus configured to perform a process of an atomic layer deposition (ALD) method in which a thin unit film, which is approximately a monomolecular layer, is repeatedly stacked on a target substrate while switching a plurality of processing gases. The substrate processing apparatus 10 forms a film on a substrate by, for example, PEALD (Plasma Enhanced Atomic Layer Deposition) using plasma during film formation. The substrate processing apparatus 10 has a plurality of sensors that measure states such as the temperature of the substrate, the pressure in the chamber, the gas flow rate, the radio-frequency power supply, the valve operation, the robot operation, and the like during execution of a process on a substrate. The substrate processing apparatus 10 transmits data measured by these sensors and various types of information such as operation information representing the operation state of each part to the information processing device 100 as measurement data.

When the substrate processing apparatus 10 finishes processing the substrates, for example, when a plurality of substrates is processed at a time, the measurement apparatus 20 selects an arbitrary number of substrates from among the plurality of substrates to measure a film thickness. The measurement apparatus 20 transmits measurement results to the information processing device 100 as process result data.

The information processing device 100 receives and acquires measurement data from the substrate processing apparatus 10. Further, the information processing device 100 also receives and acquires result data from the measurement apparatus 20. The information processing device 100 selects parameters of the measurement data having a large effect on the result data based on the measurement data and the result data thus obtained. The information processing device 100 may be integrated with the substrate processing apparatus 10.

[Configuration of Information Processing Device 100]

Figure 2:
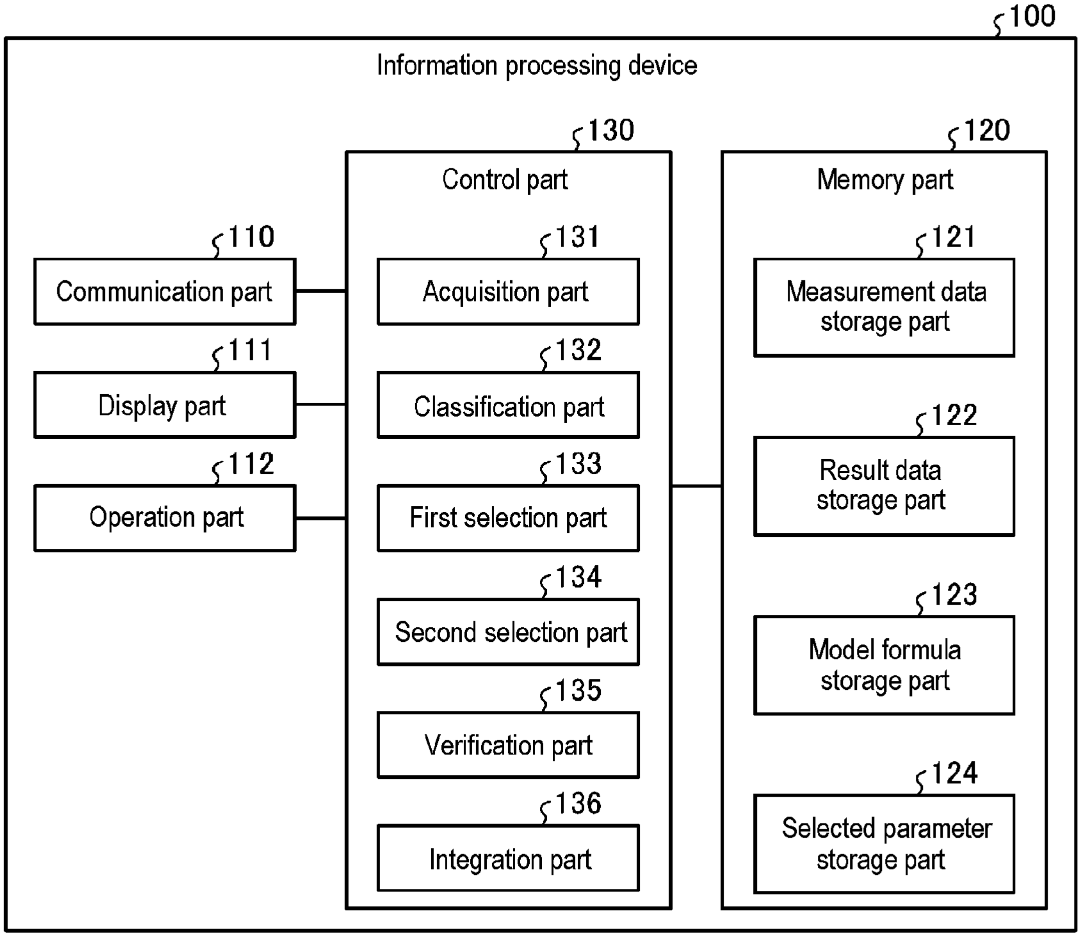
FIG. 2 is a block diagram illustrating an example of an information processing device according to an embodiment of the present disclosure.

FIG. 2 is a block diagram showing an example of the information processing device according to an embodiment of the present disclosure. The information processing device 100 includes a communication part 110, a display part 111, an operation part 112, a memory part 120, and a control part 130. The information processing device 100 may include various functional parts of known computers, such as various input devices, audio output devices, and the like, in addition to the functional parts shown in FIG. 2.

The communication part 110 is realized by, for example, a NIC (Network Interface Card) or the like. The communication part 110 is a communication interface that is connected to the substrate processing apparatus 10 and the measurement apparatus 20 by wire or wirelessly to make information communication with the substrate processing apparatus 10 and the measurement apparatus 20. The communication part 110 receives measurement data from the substrate processing apparatus 10. The communication part 110 also receives result data from the measurement apparatus 20. The communication part 110 outputs the received measurement data and result data to the control part 130.

The display part 111 is a display device for displaying various types of information. The display part 111 is realized by, for example, a liquid crystal display as a display device. The display part 111 displays various screens such as a display screen inputted from the control part 130, and the like.

The operation part 112 is an input device that receives various operations from the user of the information processing device 100. The operation part 112 is realized by, for example, a keyboard, a mouse, or the like as an input device. The operation part 112 outputs the operation inputted by the user to the control part 130 as operation information. The operation part 112 may be realized by a touch panel or the like as an input device. The display device of the display part 111 and the input device of the operation part 112 may be integrated.

The memory part 120 is realized by, for example, a RAM (Random Access Memory), a semiconductor memory device such as a flash memory or the like, or a memory device such as a hard disk or an optical disk. The memory part 120 includes a measurement data storage part 121, a result data storage part 122, a model formula storage part 123, and a selected parameter storage part 124. The memory part 120 also stores information used for processing in the control part 130.

The measurement data storage part 121 stores data measured by various sensors each time a process is executed (every run) on a substrate in the substrate processing apparatus 10, and measurement data which is operation information data representing the operation state of each part. In the present embodiment, each item of the measurement data, such as a temperature and a pressure, is represented as a parameter. In the case of an ALD process, the measurement data may be, for example, table form data in which the number of runs is indicated on the vertical axis and parameters in each step and each cycle are indicated on the horizontal axis.

Figure 3:
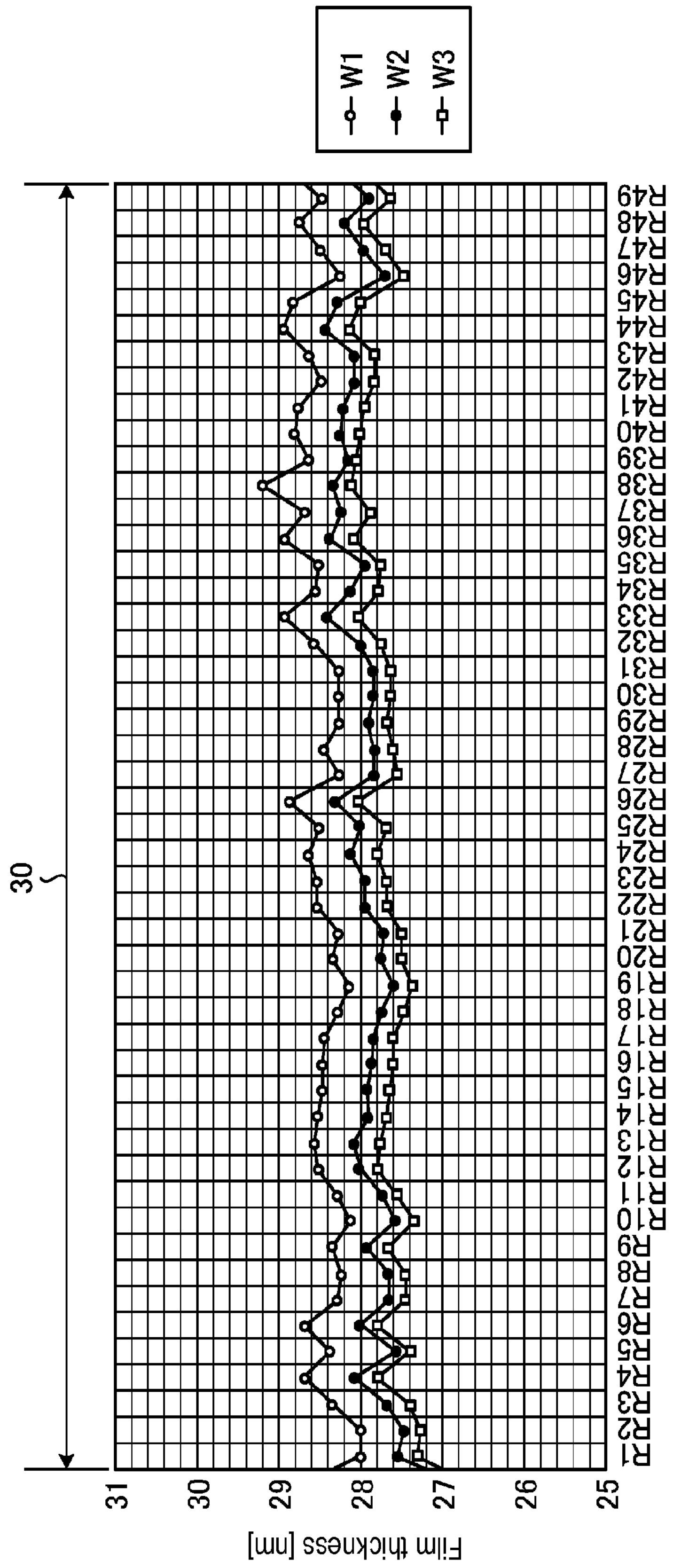
FIG. 3 is a diagram illustrating an example of analysis target runs.

The result data storage part 122 stores data representing the substrate processing result measured by the measurement apparatus 20, such as a film thickness and the like, in association with the substrate. FIG. 3 is a diagram showing an example of analysis target runs. In FIG. 3, runs R1 to R49 shown in section 30 are analysis target runs, and the film thicknesses of substrates W1 to W3 at three locations, top, center, and bottom, are graphed from a plurality of substrates batch-processed in each run. The result data storage part 122 stores, for example, the film thicknesses of the substrates W1 to W3 in each run as result data in association with the substrates W1 to W3.

Returning to FIG. 2, the model formula storage part 123 stores a model formula based on the result of analysis of the correlation between the respective parameters selected as highly correlated with the result data. The model formula uses, for example, a linear regression model such as a least-squares method with the film thickness as an objective variable and each parameter as an explanatory variable. The model formula is used to verify whether or not the selected parameters satisfy predetermined results.

The selected parameter storage part 124 stores finally-selected parameters as having a large effect on the result data.

The control part 130 is realized by executing a program stored in an internal memory device using, for example, a CPU (Central Processing Unit), an MPU (Micro Processing Unit), a GPU (Graphics Processing Unit), or the like, in which case the RAM is used as a work area. The control part 130 may also be realized by, for example, an integrated circuit such as an ASIC (Application Specific Integrated Circuit) or an FPGA (Field Programmable Gate Array).

The control part 130 includes an acquisition part 131, a classification part 132, a first selection part 133, a second selection part 134, a verification part 135, and an integration part 136. The control part 130 realizes or execute an information processing function or action described below. The internal configuration of the control part 130 is not limited to the configuration shown in FIG. 2, and may be another configuration as long as it performs information processing described later.

The acquisition part 131 receives and acquires measurement data from the substrate processing apparatus 10 via the communication part 110. Further, the acquisition part 131 receives and acquires result data from the measurement apparatus 20 via the communication part 110. That is, the acquisition part 131 acquires a plurality of parameters in the measurement data of a plurality of sensors regarding a process performed in the substrate processing apparatus 10 and process result data corresponding to the plurality of parameters. The acquisition part 131 stores the measurement data and the result data in the measurement data storage part 121 and the result data storage part 122, respectively, and outputs a classification instruction to the classification part 132.

When a classification instruction is inputted from the acquisition part 131, the classification part 132 selects a specific clustering method from a plurality of clustering methods that classifies a plurality of parameters of measurement data into a plurality of groups based on a predetermined rule. When instructed by the verification part 135 to redo the classification using changed plural types of clustering methods, the classification part 132 selects a specific clustering method by changing the plural types of clustering methods from the previous clustering method. The plural types of clustering methods include, for example, a process-step-based grouping in an ALD process and an ALD-cycle-based grouping in an ALD process. Further, as the plural types of clustering methods, it may be possible to use, for example, grouping based on two or more of a temperature, a pressure, a gas flow rate, a valve operation, and a robot operation. In addition, as the plural types of clustering methods, it may be possible to use, for example, grouping based on randomly selected two or more of a temperature, a pressure, a gas flow rate, a valve operation, and a robot operation.

The classification part 132 classifies the measurement data into a plurality of groups according to the selected specific clustering method. Further, when a specific clustering method is designated by the second selection part 134, the classification part 132 classifies the measurement data into a plurality of groups according to the designated specific clustering method.

After classifying the measurement data, the classification part 132 refers to the measurement data storage part 121 and the result data storage part 122, and normalizes the measurement data while excluding the measurement data that lacks the result data and the measurement data that has a predetermined lacking value or more. The classification part 132 reduces multicollinearity of the normalized measurement data based on the correlation coefficient between parameters. The classification part 132 reduces multicollinearity by, for example, narrowing down parameters with high correlation coefficients, such as heater power and temperature, to one. The classification part 132 outputs the classified measurement data with reduced multicollinearity to the first selection part 133.

Figure 4:
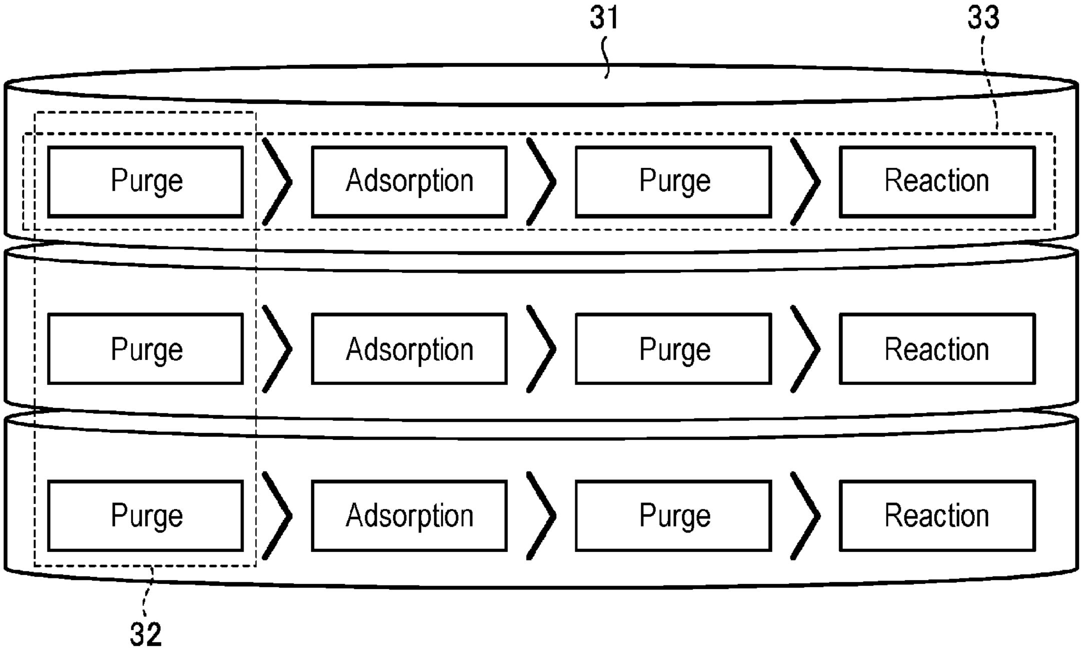
FIG. 4 is a diagram illustrating an example of a measurement data clustering method.

FIG. 4 is a diagram showing an example of a measurement data clustering method. FIG. 4 shows a clustering method 32 for grouping the measurement data 31 in a first purge as a process-step-based grouping, and a clustering method 33 for grouping one layer of ALD as an ALD-cycle-based grouping. As described above, in the present embodiment, by grouping the same measurement data in different ways, it is possible to prevent overlooking of parameters having a large effect on the result data.

Returning to FIG. 2, when the measurement data classified into a plurality of groups and having reduced multicollinearity are inputted from the classification part 132, the first selection part 133 combines the measurement data for each group for each of the plurality of groups. For example, when the process steps are classified into four groups of purge, adsorption, purge, and reaction as shown in FIG. 4, the first selection part 133 combines the measurement data in each group to generate four measurement data corresponding to each group. The first selection part 133 refers to the result data storage part 122, performs a feature selection process for each group, and selects parameters of measurement data having a large effect on the result data based on a threshold value. Methods such as, for example, a filter method, a wrapper method, and a built-in method may be used as the feature selection process. The first selection part 133 selects a parameter whose degree of effect on the model accuracy, i.e., the degree of effect on the result data is higher than a predetermined threshold value, for example, by a feature selection process using a wrapper method.

The first selection part 133 combines the measurement data of the parameters selected in each group. The first selection part 133 may combine the measurement data of the parameters selected in all groups, or may further group the measurement data of the parameters selected in each group and repeat a feature selection process for each group. In other words, the first selection part 133 may repeat a feature selection process for each group in a tournament format that repeats comparing specific groups among a plurality of groups to select preferable groups and comparing the selected groups to select more preferable groups. The first selection part 133 combines, for example, the measurement data of parameters selected in four groups. The first selection part 133 performs a feature selection process (e.g., a wrapper method) on the combined measurement data, and selects parameters having a higher degree of effect on the result data than a predetermined threshold value. The first selection part 133 outputs the selected parameters to the second selection part 134.

When the parameters selected from the first selection part 133 are inputted, the second selection part 134 refers to the result data storage part 122, analyzes the correlation with the result data using a statistical algorithm such as a linear regression model or the like, and selects parameters having high correlation with the result data. Machine learning such as a genetic algorithm or the like may be used for the correlation analysis. The second selection part 134 outputs the selected parameters to the verification part 135 and stores the model formula based on the result of the correlation analysis in the model formula storage part 123.

After outputting the selected parameters to the verification part 135, the second selection part 134 determines whether or not there are unprocessed clustering methods among the plural types of clustering methods. When it is determined that there are unprocessed clustering methods, the second selection part 134 selects a specific clustering method to be processed next from the unprocessed clustering methods, and instructs the classification part 132 to classify the measurement data into a plurality of groups using the selected specific clustering method. On the other hand, when it is determined that there is no unprocessed clustering method, the second selection part 134 instructs the verification part 135 to perform verification.

The verification part 135 receives the selected parameters corresponding to each specific clustering method from the second selection part 134. For example, the verification part 135 receives selected parameters corresponding to the process-step-based clustering method and selected parameters corresponding to the ALD-cycle-based clustering method.

When instructed by the second selection part 134 to perform verification, the verification part 135 refers to the model formula storage part 123 and verifies each selected parameter using a model formula corresponding to each specific clustering method. The verification part 135 verifies the model formula in which each selected parameter is used as an explanatory variable and the result data is used as an objective variable. The verification part 135 verifies, for example, the predicted value based on the model formula and the measured value using a scatter diagram. The verification part 135 determines whether the verification result satisfies a predetermined result. For example, if the determination coefficient is equal to or greater than a predetermined value (e.g., 0.7), the verification part 135 determines that the verification result satisfies the predetermined result.

When it is determined that the verification result does not satisfy the predetermined result, the verification part 135 does not adopt the selected parameter and changes the plural types of clustering methods. The verification part 135 changes, for example, the process-step-based clustering method or the ALD-cycle-based clustering method. The verification part 135 instructs the classification part 132 to redo the classification using the changed plural types of clustering methods. On the other hand, when it is determined that the verification result satisfies the predetermined result, the verification part 135 determines whether or not the verification of the selected parameter has been repeated a predetermined number of times. If it is determined that the verification has not been repeated the predetermined number of times, the verification part 135 adopts the selected parameter and changes the plural types of clustering methods. The verification part 135 instructs the classification part 132 to redo the classification using the changed plural types of clustering methods. If it is determined that the verification has been repeated the predetermined number of times, the verification part 135 outputs the parameters selected for each specific clustering method to the integration part 136.

When the parameters selected for each specific clustering method are inputted from the verification part 135, the integration part 136 integrates the inputted parameters selected for each specific clustering method. For example, if 5 parameters are selected in the process-step-based clustering method, 7 parameters are selected in the ALD-cycle-based clustering method, and 3 overlapping parameters are present, the integration part 136 uses 9 parameters as the parameters of the integration result. The integration part 136 selects the parameters of the integration result as parameters having a large effect on the result data, and stores the selected parameters in the selected parameter storage part 124 as the final result.

[Parameter Selection by Tournament Format]

Referring now to FIGS. 5 to 10, a case will be described where the parameters having a large effect on the result data are selected by a tournament format using a process-step-based grouping and an ALD-cycle-based grouping.

Figure 5:
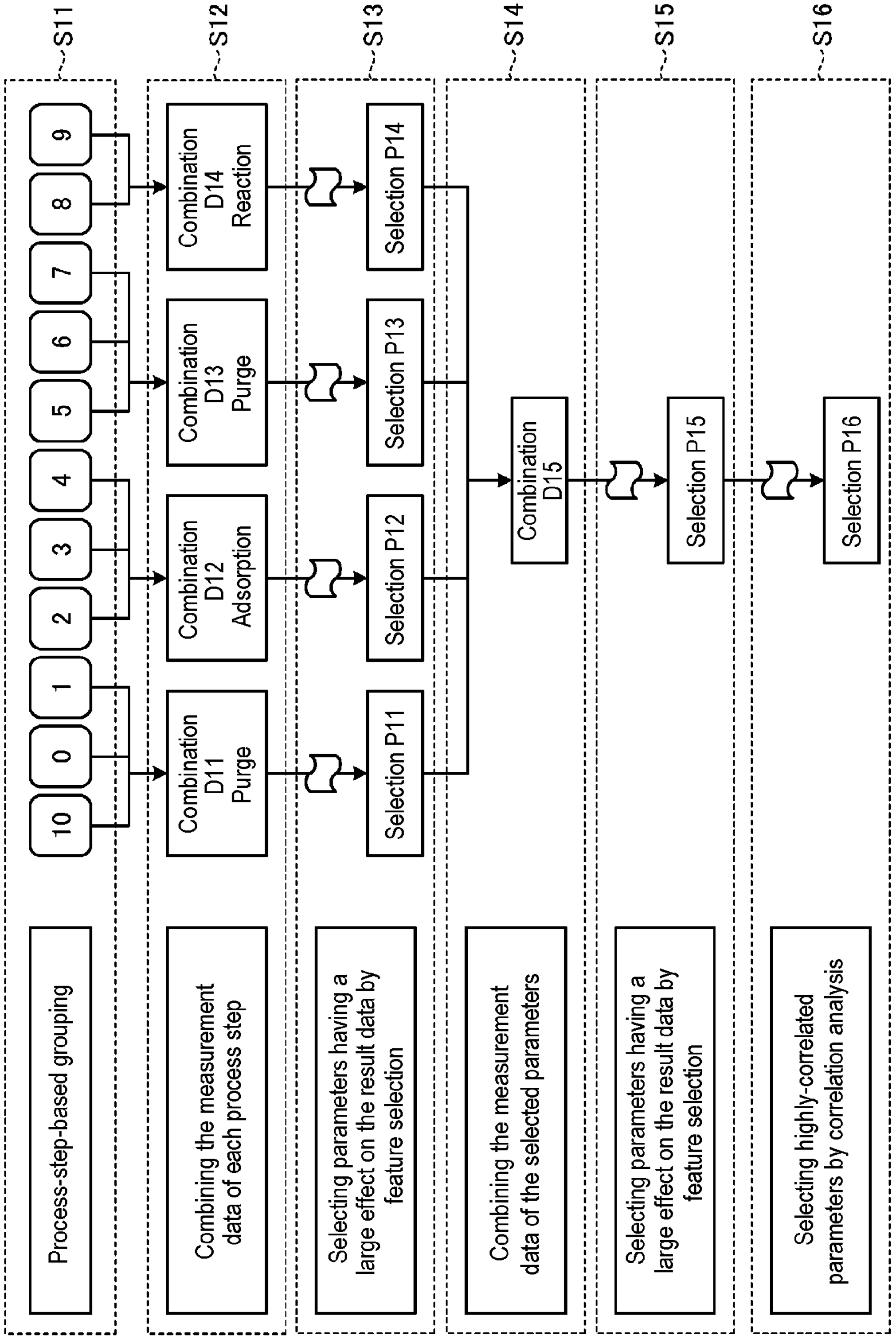
FIG. 5 is a diagram illustrating an example of a sequence in the case of a process-step-based clustering method.

FIG. 5 is a diagram showing an example of a sequence in the case of the process-step-based clustering method. Now, it is assumed that the ALD process is a process in which a cycle including steps "0" to "10" is repeated a predetermined number of times. In the example of FIG. 5, the classification part 132 first classifies the steps "0" to "10" of the measurement data into groups of process steps of purge, adsorption, purge, and reaction (step S11). It is assumed that the number of parameters in the initial measurement data is, for example, "21033". The first selection part 133 combines the measurement data of each process step (step S12). That is, the first selection part 133 combines "10", "0" and "1" into a combination D11 corresponding to a first purge group, and combines steps "2", "3" and "4" into a combination D12 corresponding to an adsorption group. Similarly, the first selection part 133 combines steps "5", "6" and "7" into a combination D13 corresponding to a second purge group, and combines steps "8" and "9" into a combination D14 corresponding to a reaction group.

The first selection part 133 selects selections P11 to P14 as parameters having a large effect on the result data by feature selection for the combinations D11 to D14 of the measurement data (step S13). At this time, the first filtering is performed to narrow down the result data, for example, the parameters having a large effect on the film thickness to some extent. The number of parameters for the selections P11 to P14 after the first filtering is narrowed down to, for example, "60". The first selection part 133 combines the measurement data corresponding to the selections P11 to P14, which are the selected parameters, to form a combination D15 (step S14). The first selection part 133 selects a selection P15 as parameters having a large effect on the result data by feature selection for the combination D15 of the measurement data (step S15). At this time, the second filtering is performed on the combination D15 to further narrow down the parameters having a large effect on the result data. The number of parameters for the selection P15 after the second filtering is narrowed down to, for example, "26". The second selection part 134 performs correlation analysis with the result data of the selection P15, which is the selected parameter, and selects a selection P16, which is a parameter highly correlated with the result data (step S16). The number of parameters for the selection P16 after the correlation analysis is narrowed down to, for example, "4".

Figure 6:
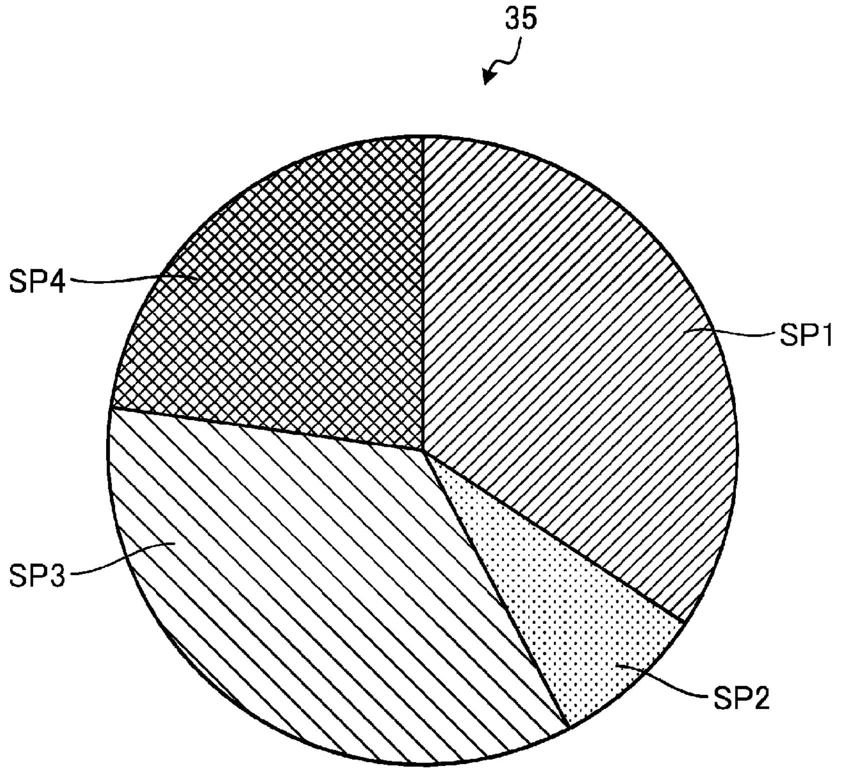
FIG. 6 is a graph showing an example of the degree of contribution of selected parameters to result data.

FIG. 6 is a graph showing an example of the degree of contribution of the selected parameters to the result data. The graph 35 shown in FIG. 6 is the breakdown of the selection P16 selected in step S16 of FIG. 5. That is, the selection P16 is the four parameters SP1 to SP4 that are highly correlated with the result data. From the graph 35, it can be seen that among the parameters SP1 to SP4, the parameters SP1 and SP3 have a high degree of contribution to the result data.

Figure 7:
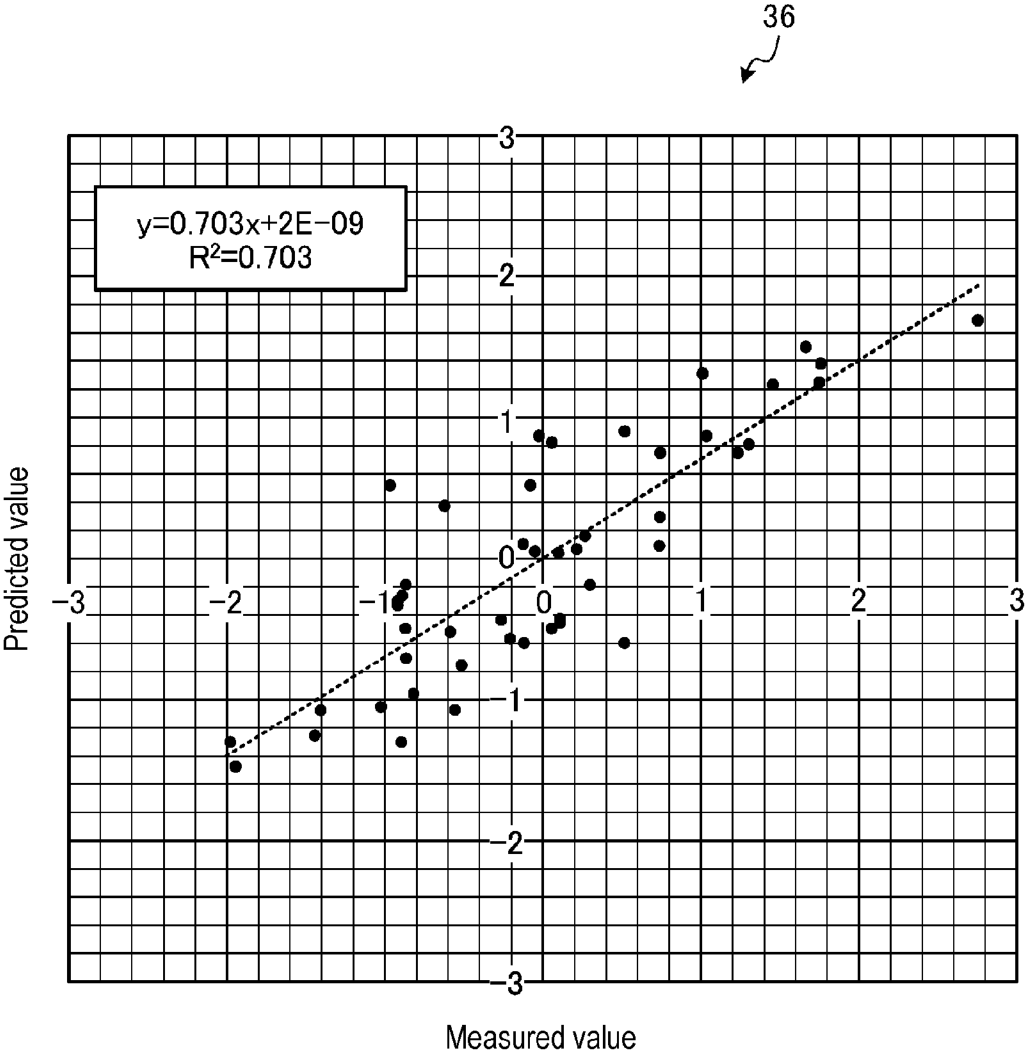
FIG. 7 is a diagram illustrating an example of a parameter verification result using a model formula.

FIG. 7 is a diagram showing an example of a verification result of parameters using a model formula. The graph 36 shown in FIG. 7 shows the verification result using a model formula for the four parameters SP1 to SP4 that are highly correlated with the result data. As shown in the graph 36, the verification result has a determination coefficient $R^2=0.703$, which is equal to or greater than the predetermined value (0.7 in the present embodiment). In this case, the verification result satisfies the predetermined result.

Figure 8:
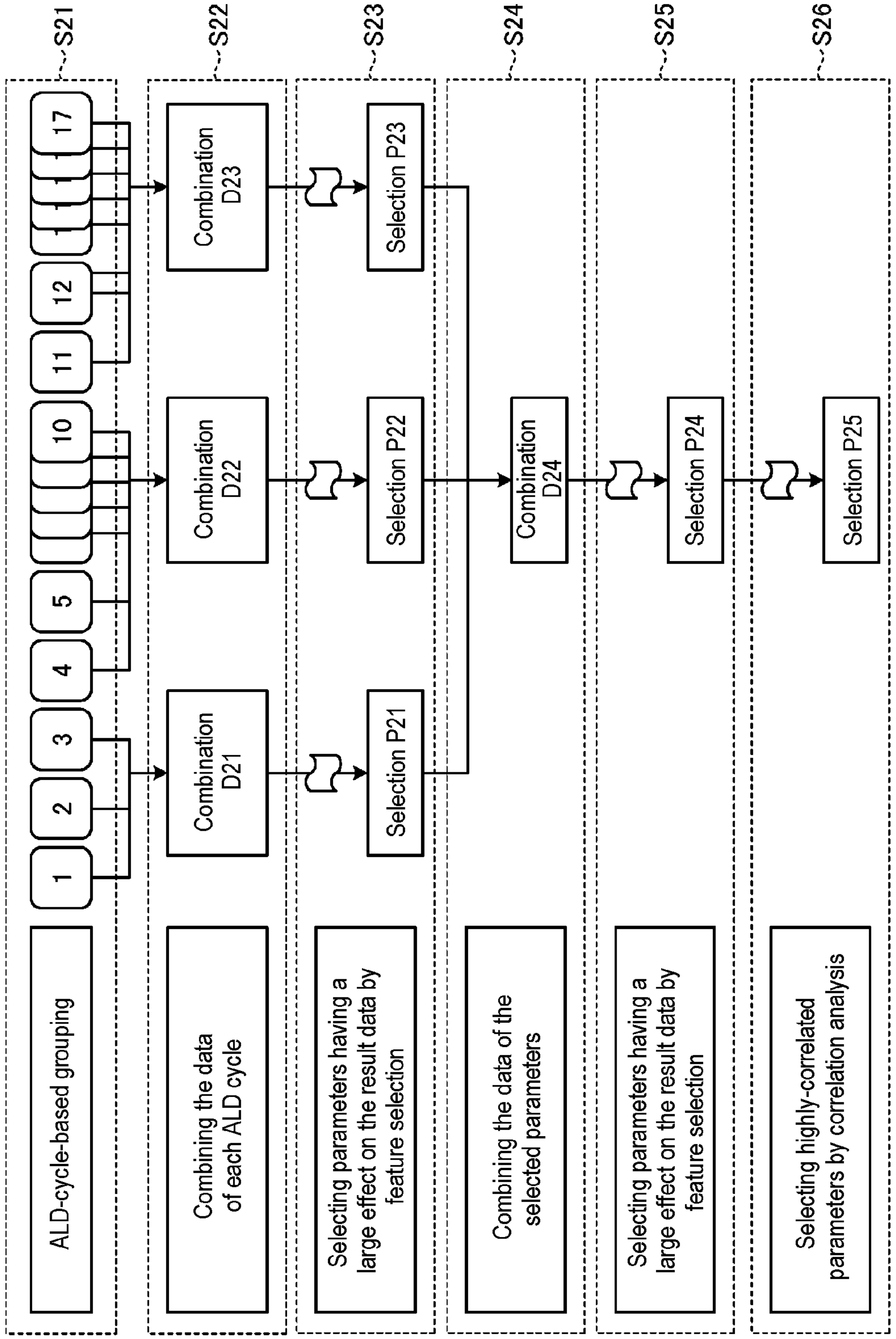
FIG. 8 is a diagram illustrating an example of a sequence in the case of an ALD-cycle-based clustering method.

FIG. 8 is a diagram showing an example of a sequence in the case of the ALD-cycle-based clustering method. It is assumed that as the ALD process, a process constituting a plurality of steps is repeated a predetermined number of times as one cycle. In the example of FIG. 8, the classification part 132 first classifies the cycles from "1" to "17" of the measurement data into a former half group, a middle group, and a latter half group of the ALD cycle (step S21). The first selection part 133 combines the measurement data of each ALD cycle (step S22). It is assumed that the number of parameters in the initial measurement data is, for example, "21033". That is, the first selection part 133 combines the cycles "1" to "3" into a combination D21 corresponding to the former half group, and combines the cycles "4" to "10" into a combination D22 corresponding to the middle group. Similarly, the first selection part 133 combines the cycles “11” to “17” into a connection D23 corresponding to the latter half group.

The first selection part 133 selects selections P21 to P23 as parameters having a large effect on the result data by feature selection for the combinations D21 to D23 of the measurement data (step S23). Here, the first filtering is performed as in step S13 of FIG. 5. It is assumed that the number of parameters for the selections P21 to P23 after the first filtering is narrowed down to, for example, “41”. The first selection part 133 combines the measurement data corresponding to the selected parameters P21 to P23 to form a combination D24 (step S24). The first selection part 133 selects a selection P24 as the parameters having a large effect on the result data by feature selection for the combination D24 of the measurement data (step S25). Here, the second filtering is performed on the combination D24 in the same manner as in step S15 of FIG. 5. It is assumed that the number of parameters of the selection P24 after the second filtering is narrowed down to, for example, “22”. The second selection part 134 performs correlation analysis with the result data of the selection P24, which is the selected parameter, and selects a selection P25, which is a parameter highly correlated with the result data (step S26). It is assumed that the number of parameters for the selection P25 after the correlation analysis is narrowed down to, for example, “6”.

Figure 9:
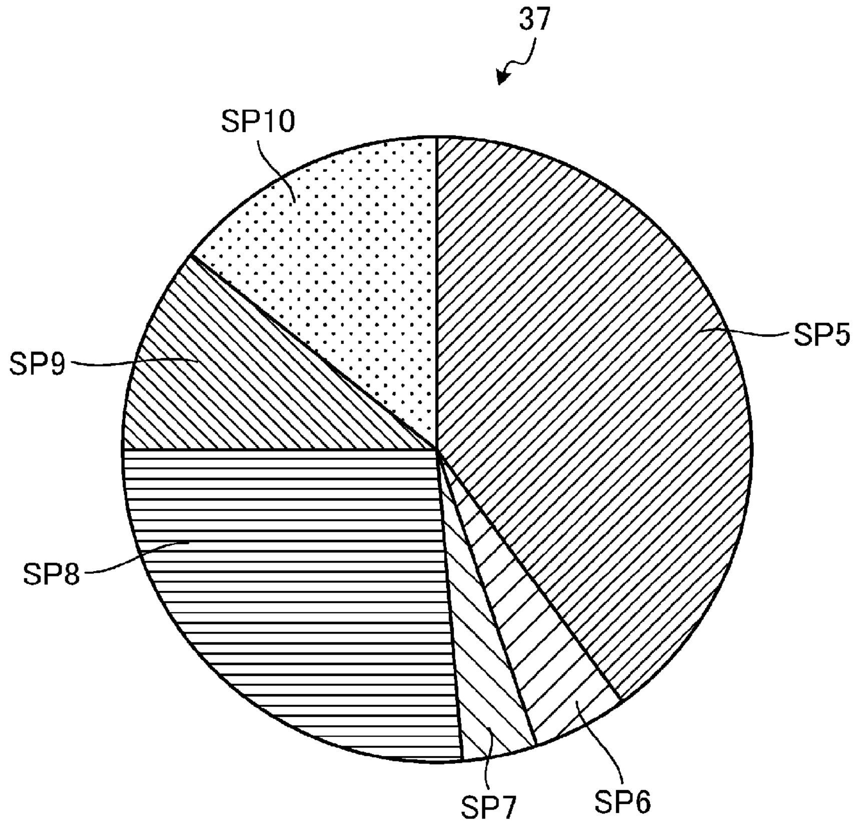
FIG. 9 is a graph showing an example of the degree of contribution of selected parameters to result data.

FIG. 9 is a graph showing an example of the degree of contribution of selected parameters to result data. The graph 37 shown in FIG. 9 is the breakdown of the selection P25 selected in step S26 of FIG. 8. In other words, the selection P25 is the six parameters SP5 to SP10 that are highly correlated with the result data. From the graph 37, it can be seen that among the parameters SP5 to SP10, the parameters SP5 and SP8 have a high degree of contribution to the result data.

Figure 10:
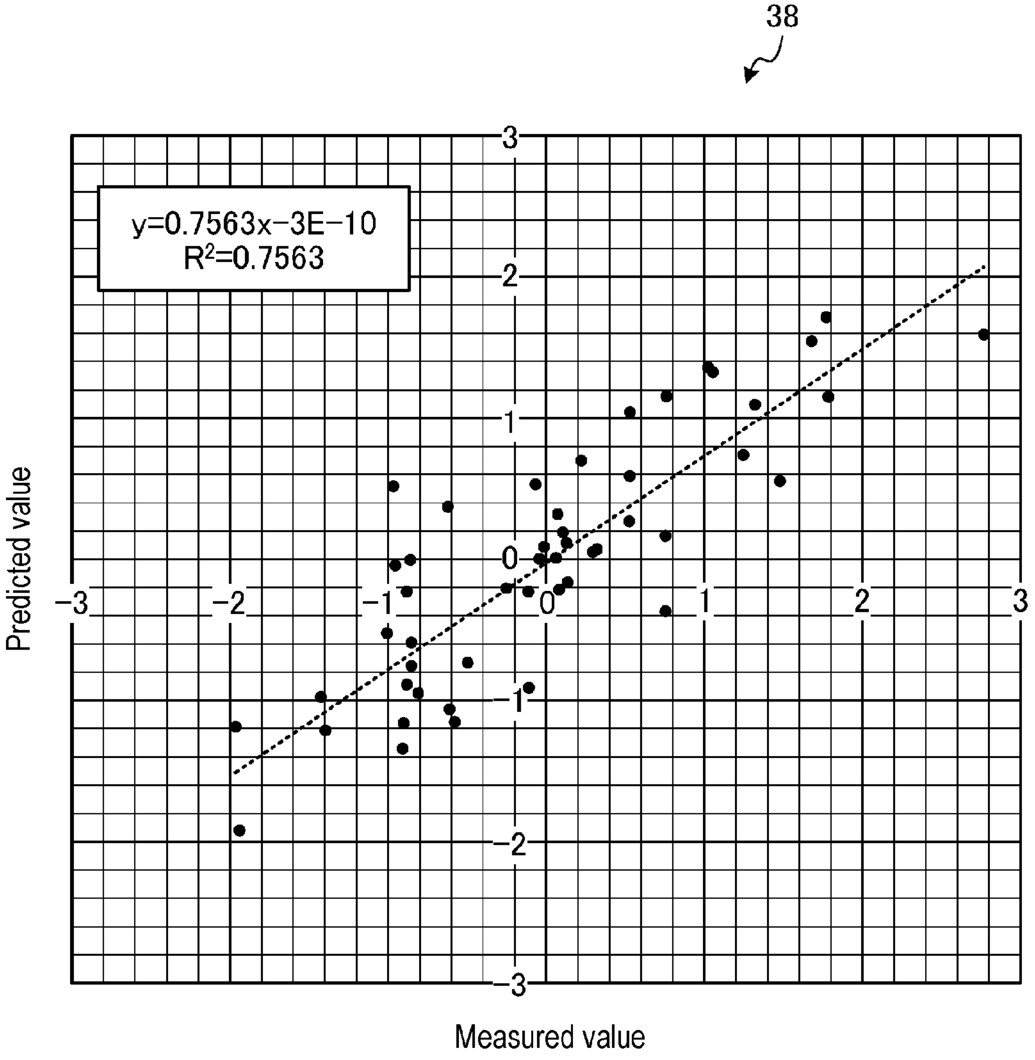
FIG. 10 is a diagram illustrating an example of a parameter verification result using a model formula.

FIG. 10 is a diagram showing an example of a verification result of parameters using a model formula. The graph 38 shown in FIG. 10 shows the verification result using a model formula for the six parameters SP5 to SP10 that are highly correlated with the result data. As shown in graph 38, the verification result has a determination coefficient $R^2=0.7563$, which is equal to or greater than the predetermined value (0.7 in the present embodiment). In this case, the verification result satisfies the predetermined result.

[Parameter Selection Method]

Figure 11:
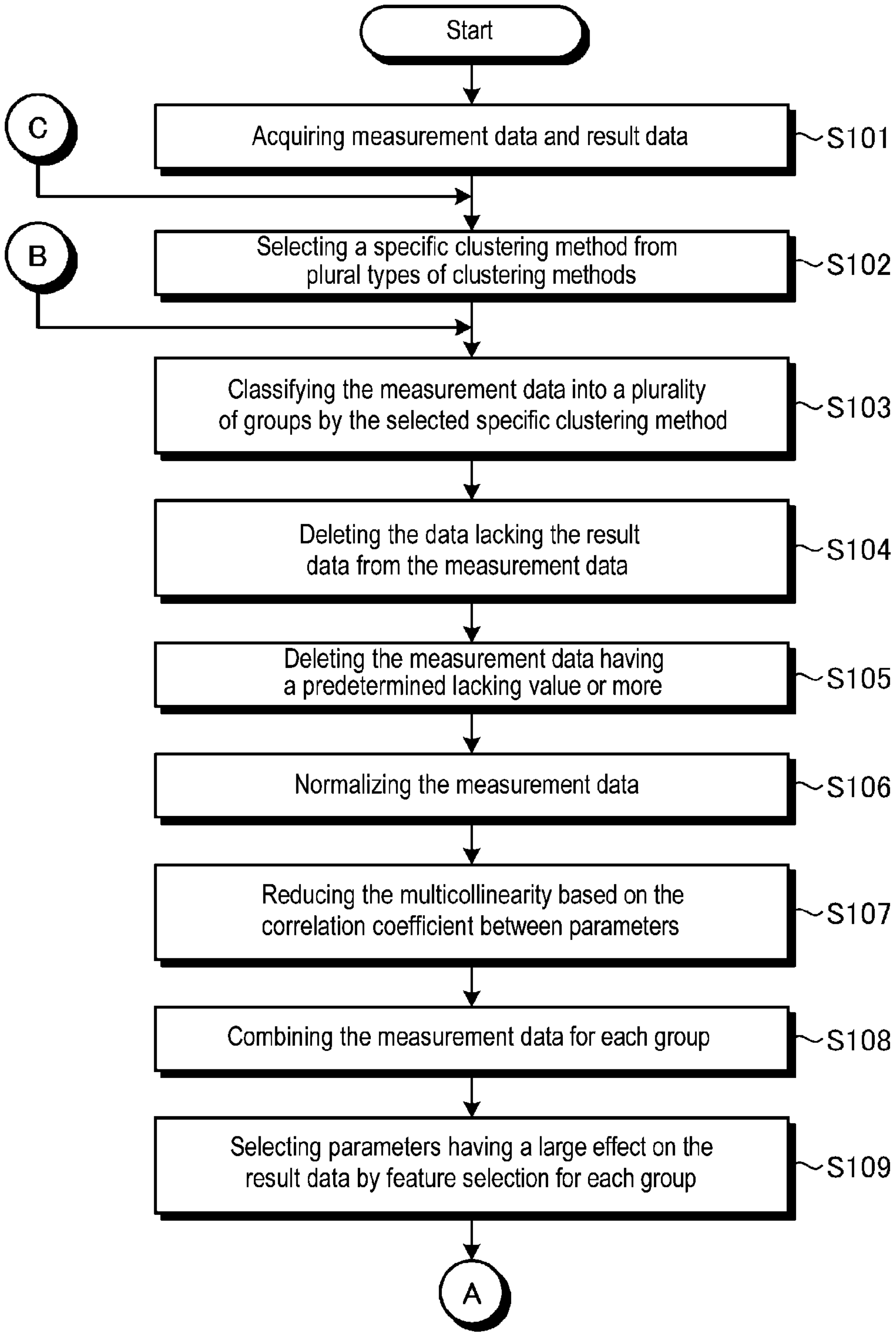
FIG. 11 is a flowchart illustrating an example of a parameter selection process according to the present embodiment.
Figure 12:
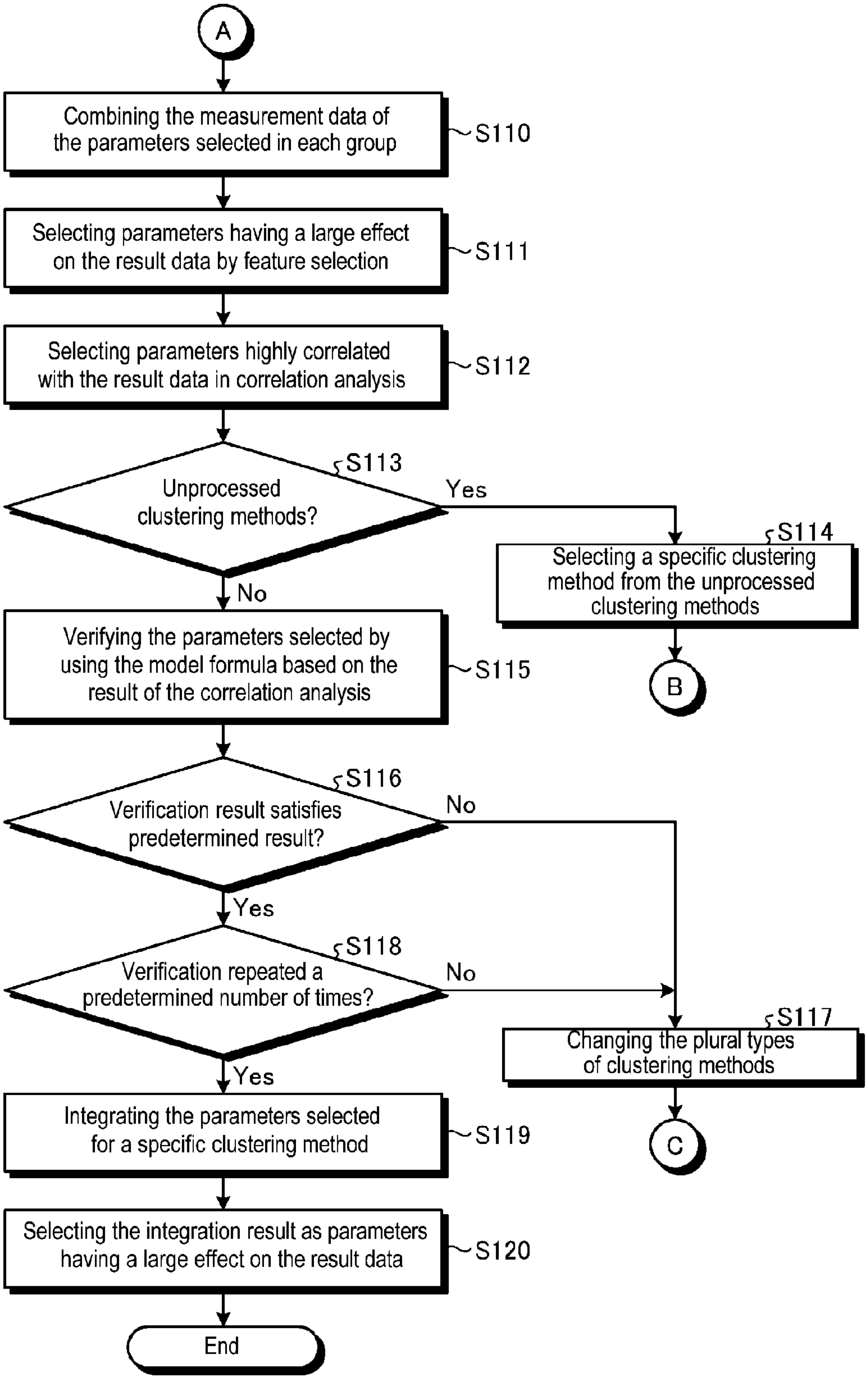
FIG. 12 is a flowchart illustrating an example of the parameter selection process according to the present embodiment.

Next, the operation of the information processing device 100 according to the present embodiment will be described. FIGS. 11 and 12 are flowcharts showing an example of a parameter selection process according to the present embodiment.

The acquisition part 131 of the information processing device 100 receives and acquires measurement data from the substrate processing apparatus 10. In addition, the acquisition part 131 receives and acquires result data from the measurement apparatus 20 (step S101). The acquisition part 131 stores the acquired measurement data and the acquired result data in the measurement data storage part 121 and the result data storage part 122, respectively, and outputs a classification instruction to the classification part 132.

When the classification instruction is inputted from the acquisition part 131, the classification part 132 selects a specific clustering method from plural types of clustering methods for classifying a plurality of parameters of the measurement data into a plurality of groups (step S102). The classification part 132 classifies the measurement data into a plurality of groups according to the selected specific clustering method (step S103).

After classifying the measurement data, the classification part 132 refers to the measurement data storage part 121 and the result data storage part 122, and deletes the measurement data lacking the result data (step S104). Further, the classification part 132 deletes the measurement data having a predetermined lacking amount or more (step S105). At this time, the lack of the measurement data whose lack is less than a predetermined value is complemented. In addition, as a method of complementing the lacking data, a general method using an intermediate value or an average value of the former and latter data may be used. Furthermore, the classification part 132 normalizes the measurement data (step S106). The classification part 132 reduces multicollinearity of the normalized measurement data based on the correlation coefficient between parameters (step S107). The classification part 132 outputs the classified measurement data with reduced multicollinearity to the first selection part 133.

When the measurement data classified into a plurality of groups and having reduced multicollinearity are inputted from the classification part 132, the first selection part 133 combines the measurement data for each group for each of the plurality of groups (step S108). The first selection part 133 refers to the result data storage part 122 and selects parameters of the measurement data having a large effect on the result data by feature selection for each group (step S109). The first selection part 133 combines the measurement data of the parameters selected in each group (step S110). The first selection part 133 selects the parameters having a large effect on the result data by feature selection for the combined measurement data (step S111). The first selection part 133 outputs the selected parameters to the second selection part 134.

When the selected parameters are inputted from the first selection part 133, the second selection part 134 refers to the result data storage part 122, performs correlation analysis with the result data, and selects a parameter highly correlated with the result data (step S112). The second selection part 134 outputs the selected parameters to the verification part 135 and stores the model formula based on the result of the correlation analysis in the model formula storage part 123.

After outputting the selected parameters to the verification part 135, the second selection part 134 determines whether or not there are unprocessed clustering methods among the plural types of clustering methods (step S113). If it is determined that there are unprocessed clustering methods (step S113: Yes), the second selection part 134 selects a specific clustering method to be processed next from the unprocessed clustering methods (step S114), and outputs the selected specific clustering method to the classification part 132. The process returns to step S103. On the other hand, when it is determined that there is no unprocessed clustering method (step S113: No), the second selection part 134 instructs the verification part 135 to perform verification.

When instructed to perform verification by the second selection part 134, the verification part 135 refers to the model formula storage part 123, and verifies the parameters selected by each specific clustering method by using the model formula based on the result of the correlation analysis (step S115). The verification part 135 determines whether the verification result satisfies a predetermined result (step S116). If it is determined that the verification result does not satisfy the predetermined result (step S116: No), the verification part 135 does not adopt the selected parameters, changes the plural types of clustering methods (step S117), and outputs the changed plural types of clustering methods to the classification part 132. The process returns to step S102. On the other hand, when it is determined that the verification result satisfies the predetermined result (step S116: Yes), the verification part 135 determines whether the verification of the selected parameters has been repeated a predetermined number of times (step S118). If it is determined that the verification has not been repeated the predetermined number of times (step S118: No), the verification part 135 adopts the selected parameters. The process proceeds to step S117. If it is determined that the verification has been repeated the predetermined number of times (step S118: Yes), the verification part 135 outputs the parameters selected for each specific clustering method to the integration part 136.

When the parameters selected for each specific clustering method are inputted from the verification part 135, the integration part 136 integrates the inputted parameters selected for each specific clustering method (step S119). The integration part 136 selects the parameters of the integration result as parameters having a large effect on the result data (step S120), and stores the parameters of the integration result in the selected parameter storage part 24 as a final result. This makes it possible to efficiently select parameters having a large effect on the substrate processing result without relying on human knowledge. In addition, for example, the film thickness is measured when the film forming process on the substrate is completed. If there is a change in the film thickness, the change can be fed back to the substrate processing apparatus 10 so that, for example, one parameter is changed from the selected parameters.

As described above, according to the present embodiment, the information processing device 100 performs processing steps including: (a) acquiring a plurality of parameters of measurement data of a plurality of sensors regarding a process in a substrate processing apparatus 10 and result data of the process corresponding to the measurement data; (b) classifying the acquired parameters into a plurality of groups by a specific clustering method; (c) selecting parameters having a large effect on the result data based on a threshold value for each of the plurality of groups; (d) repeating (c) in a tournament format between groups for the parameters selected for each group; and (e) selecting parameters highly correlated with the result data by correlation analysis between the parameters selected in (d). As a result, it is possible to efficiently select parameters having a large effect on the substrate processing result.

Further, according to the present embodiment, the information processing device 100 performs processing steps including: (f) executing (b), (c), (d) and (e) for each of plural types of specific clustering methods; and (g) selecting a result of integration of the parameters selected for each of the plural types of specific clustering methods as the parameters having a large effect on the result data. As a result, by grouping the same measurement data in different ways, it is possible to suppress overlooking of the parameters having a large effect on the result data.

Further, according to the present embodiment, the process is an ALD (Atomic Layer Deposition) process, and the plural types of specific clustering methods includes a process-step-based grouping in the ALD process and an ALD-cycle-based grouping in the ALD process. As a result, it is possible to efficiently select parameters having a large effect on the substrate processing result in the ALD process.

Further, according to the present embodiment, the information processing device 100 performs a process including: (h) verifying a model formula based on the result of the correlation analysis by using the parameters selected in (g) as an explanatory variable and using the result data as an objective variable, and if the verification result does not satisfy a predetermined result, changing the specific clustering method and executing (f) and (g) without adopting the selected parameters. As a result, it is possible to efficiently select parameters having a large effect on the substrate processing result.

Further, according to the present embodiment, the plural types of specific clustering methods include grouping based on two or more of a temperature, a pressure, a gas flow rate, a valve operation, and a robot operation. As a result, it is possible to efficiently select parameters having a large effect on the substrate processing result.

Further, according to this embodiment, the plural types of specific clustering methods include grouping based on randomly selected two or more of a temperature, a pressure, a gas flow rate, a valve operation, and a robot operation. As a result, it is possible to efficiently select parameters having a large effect on the substrate processing result.

Further, according to the present embodiment, in (c), the parameters are selected by using one of a filter method, a wrapper method and a built-in method. As a result, it is possible to select the parameters having a large effect on the result data.

Further, according to the present embodiment, in (b), the information processing device 100 classifies the acquired measurement data into a plurality of groups by a specific clustering method, normalizes the classified measurement data while excluding the measurement data that lacks the result data and the measurement data that has a predetermined lacking value or more, and reduces multicollinearity of the normalized measurement data based on the correlation coefficient between the parameters. As a result, it is possible to exclude the data that may become noise.

The embodiment disclosed this time should be considered to be exemplary in all respects and not limitative. The above-described embodiment may be omitted, substituted, or modified in various ways without departing from the scope and spirit of the appended claims.

In the above-described embodiment, the measurement data in a batch process in which a plurality of substrates is processed at a time is used as an analysis target run. However, the present disclosure is not limited thereto. For example, the measurement data in a single process in which substrates are processed one by one may be used.

Moreover, in the above-described embodiment, the ALD process is used as the process to be analyzed. However, the present disclosure is not limited thereto. For example, a CVD (Chemical Vapor Deposition) process or an etching process may be used as the process to be analyzed.

Furthermore, the various processing functions performed by each apparatus may be wholly or partially executed on a CPU (or a microcomputer such as an MPU or an MCU (Micro Controller Unit)). In addition, it goes without saying that various processing functions may be wholly or partially executed on a program analyzed and executed by a CPU (or a microcomputer such as an MPU or MCU) or on the hardware based on wired logic.

Figure 13:
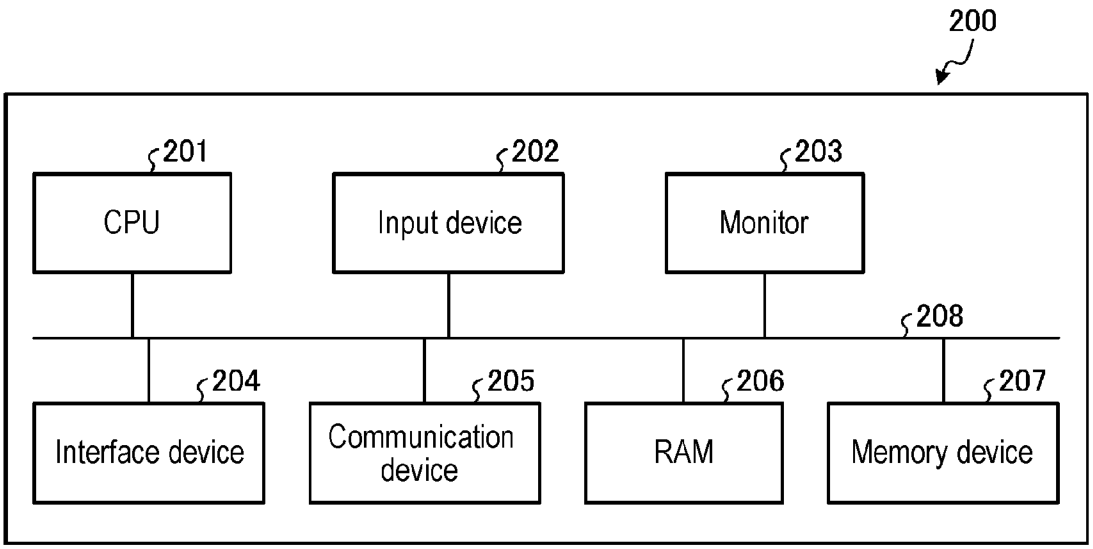
FIG. 13 is a diagram illustrating an example of a computer that executes a parameter selection program.

By the way, various kinds of processes described in the above embodiment can be realized by executing a prepared program on a computer. Therefore, an example of a computer that executes a program having functions similar to those of the above embodiment will be described below. FIG. 13 is a diagram illustrating an example of a computer that executes a parameter selection program.

As shown in FIG. 13, the computer 200 includes a CPU 201 that executes various arithmetic processes, an input device 202 that receives data input, and a monitor 203. The computer 200 further includes an interface device 204 connected to various apparatuses, and a communication device 205 connected to another information processing device or the like by wire or wirelessly. The computer 200 further includes a RAM 206 that temporarily stores various information, and a memory device 207. The respective devices 201 to 207 are also connected to a bus 208.

The memory device 207 stores a parameter selection program having the same function as each of the acquisition part 131, the classification part 132, the first selection part 133, the second selection part 134, the verification part 135, and the integration part 136 shown in FIG. 2. The memory device 207 also stores the measurement data storage part 121, the result data storage part 122, the model formula storage part 123, and the selected parameter storage part 124. The input device 202 receives, for example, the input of various kinds of information such as operation information and the like from the user of the computer 200. The monitor 203 displays, for example, various screens such as a display screen and the like to the user of the computer 200. For example, a printing device and the like are connected to the interface device 204. The communication device 205 that has, for example, the same function as the communication part 110 shown in FIG. 2 is connected to a network (not shown) and configured to exchange various information with other information processing device such as the substrate processing apparatus 10 and the measurement apparatus 20.

The CPU 201 reads each program stored in the memory device 207, develops the program in the RAM 206, and executes the program, thereby performing various processes. These programs can also cause the computer 200 to function as the acquisition part 131, the classification part 132, the first selection part 133, the second selection part 134, the verification part 135, and the integration part 136 shown in FIG. 2.

The parameter selection program described above does not necessarily have to be stored in the memory device 207. For example, the computer 200 may read and execute a program stored in a storage medium readable by the computer 200. Examples of the storage medium readable by the computer 200 include a portable recording medium such as a CD-ROM, a DVD (Digital Versatile Disc), a USB (Universal Serial Bus) memory or the like, a semiconductor memory such as a flash memory or the like, a hard disk drive, and the like. Alternatively, the parameter selection program may be stored in a device connected to a public line, the Internet, a LAN, etc., and the computer 200 may read out and execute the parameter selection program therefrom.

EXPLANATION OF REFERENCE NUMERALS

1: information processing system, 10: substrate processing apparatus, 20: measurement apparatus, 100: information processing device, 110: communication part, 111: display part, 112: operation part, 120: memory part, 121: measurement data storage part, 122: result data storage part, 123: model formula storage part, 124: selected parameter storage part, 130: control part, 131: acquisition part, 132: classification part, 133: first selection part, 134: second selection part, 135: verification part, 136: integration part

What is claimed is:

1. A parameter selection method for causing a computer to execute processing steps including:

(a) acquiring a plurality of parameters in measurement data of a plurality of sensors regarding a process in a substrate processing apparatus and result data of the process corresponding to the measurement data;

(b) classifying the acquired parameters into a plurality of groups by a specific clustering method based on a process step of the process or a cycle representing one iteration of the process;

(c) selecting parameters having a degree of effect on the result data higher than a threshold value for each of the plurality of groups;

(d) repeating the step of (c) in a tournament format between the groups for the parameters selected for each of the groups;

(e) selecting parameters correlated with the result data between the parameters selected in the step of (d) based on a result of a correlation analysis;

(f) executing the steps of (b), (c), (d) and (e) for each of plural types of specific clustering methods;

(g) selecting a result of integration of the parameters selected for each of the plural types of specific clustering methods as the parameters having the degree of effect on the result data; and (i) controlling the substrate processing apparatus to change at least one parameter of the selected parameters selected in the step of (e) to adjust a substrate process condition.

2. The parameter selection method of claim 1, wherein the process is an ALD (Atomic Layer Deposition) process, and the plural types of specific clustering methods includes a process-step-based grouping in the ALD process and an ALD-cycle-based grouping in the ALD process.

3. The parameter selection method of claim 2, wherein the processing steps further includes:

(h) verifying a model formula based on the result of the correlation analysis by using the parameters selected in the step of (g) as an explanatory variable and using the result data as an objective variable, and if the verification result does not satisfy a predetermined result, changing the specific clustering method and executing the step of (f) and the step of (g) without adopting the selected parameters.

4. The parameter selection method of claim 3, wherein in the step of (c), the parameters are selected by using one of a filter method, a wrapper method, and a built-in method.

5. The parameter selection method of claim 4, wherein in the step of (b), the acquired measurement data are classified into the plurality of groups by the specific clustering method, the classified measurement data are normalized while excluding the measurement data that lacks the result data and the measurement data that has a predetermined lacking value or more, and multicollinearity of the normalized measurement data is reduced based on a correlation coefficient between the parameters.

6. The parameter selection method of claim 1, wherein the processing steps further includes:

(h) verifying a model formula based on the result of the correlation analysis by using the parameters selected in the step of (g) as an explanatory variable and using the result data as an objective variable, and if the verification result does not satisfy a predetermined result, changing the specific clustering method and executing the step of (f) and the step of (g) without adopting the selected parameters.

7. The parameter selection method of claim 1, wherein the plural types of specific clustering methods include grouping based on two or more of a temperature, a pressure, a gas flow rate, a valve operation, and a robot operation.

8. The parameter selection method of claim 1, wherein the plural types of specific clustering methods include grouping based on randomly selected two or more of a temperature, a pressure, a gas flow rate, a valve operation, and a robot operation.

9. The parameter selection method of claim 1, wherein in the step of (c), the parameters are selected by using one of a filter method, a wrapper method, and a built-in method.

10. The parameter selection method of claim 1, wherein in the step of (b), the acquired measurement data are classified into the plurality of groups by the specific clustering method, the classified measurement data are normalized while excluding the measurement data that lacks the result data and the measurement data that has a predetermined lacking value or more, and multicollinearity of the normalized measurement data is reduced based on a correlation coefficient between the parameters.

11. An information processing device, comprising:

one and more processors configured to execute:

acquiring a plurality of parameters in measurement data of a plurality of sensors regarding a process in a substrate processing apparatus and result data of the process corresponding to the measurement data;

classifying the acquired parameters into a plurality of groups by a specific clustering method based on a process step of the process or a cycle representing one iteration of the process;

selecting parameters having a degree of effect on the result data higher than a threshold value for each of the plurality of groups;

repeating the selection of the parameters in a tournament format between the groups for the parameters selected for each of the groups;

selecting parameters correlated with the result data between the parameters selected in the repeating the selection of the parameters based on a result of a correlation analysis;

executing the classifying the acquired parameters, the selecting parameters having the degree of effect, the repeating the selection of the parameters, and the selecting parameters correlated with the result data, for each of plural types of specific clustering methods;

selecting a result of integration of the parameters selected for each of the plural types of specific clustering methods as the parameters having the degree of effect on the result data; and controlling the substrate processing apparatus to change at least one parameter of the selected parameters selected in the selecting parameters correlated with the result data to adjust a substrate process condition.

* * * * *